United States Patent [19]
Greco

[11] 4,215,468
[45] Aug. 5, 1980

[54] IC EXTRACTION TOOL

[75] Inventor: Paul L. Greco, New York, N.Y.

[73] Assignee: O.K. Machine and Tool Corp., New York, N.Y.

[21] Appl. No.: 20,265

[22] Filed: Mar. 14, 1979

[51] Int. Cl.³ .............................................. H05K 3/32
[52] U.S. Cl. ........................................ 29/764; 29/278; 29/758
[58] Field of Search ................. 29/764, 762, 758, 741, 29/278, 626

[56] References Cited
U.S. PATENT DOCUMENTS

| | | | |
|---|---|---|---|
| 3,443,297 | 5/1969 | Lusby, Jr. .............................. | 29/764 |
| 3,699,629 | 10/1972 | Hood, Jr. et al. ..................... | 29/764 |
| 3,896,533 | 7/1975 | Ullman et al. ....................... | 29/764 X |

FOREIGN PATENT DOCUMENTS 2745966  10/1977  Fed. Rep. of Germany ............. 29/764

*Primary Examiner*—Carl E. Hall

[57] ABSTRACT

An extraction tool for a packaged IC is described. The tool is characterized by gripping means for gripping opposite sides of the IC when the tool is actuated by pulling up on a slider, and for applying a uniform lifting force to the IC when the gripping means contacts the IC, to avoid deforming the IC pins.

11 Claims, 16 Drawing Figures

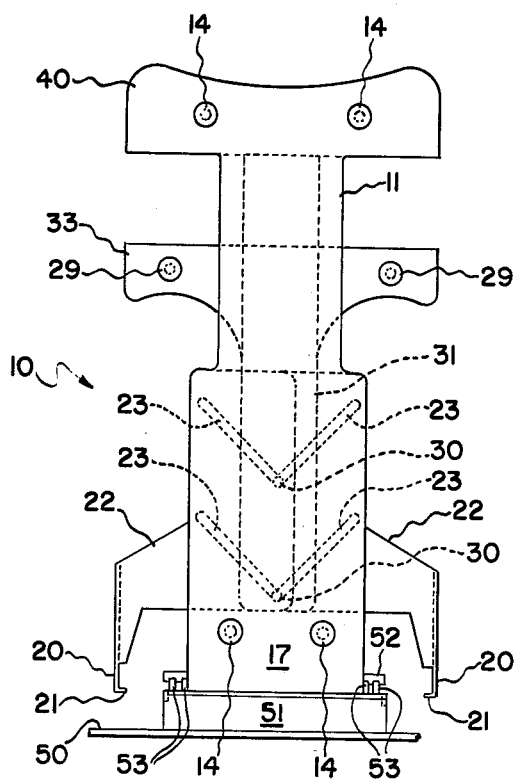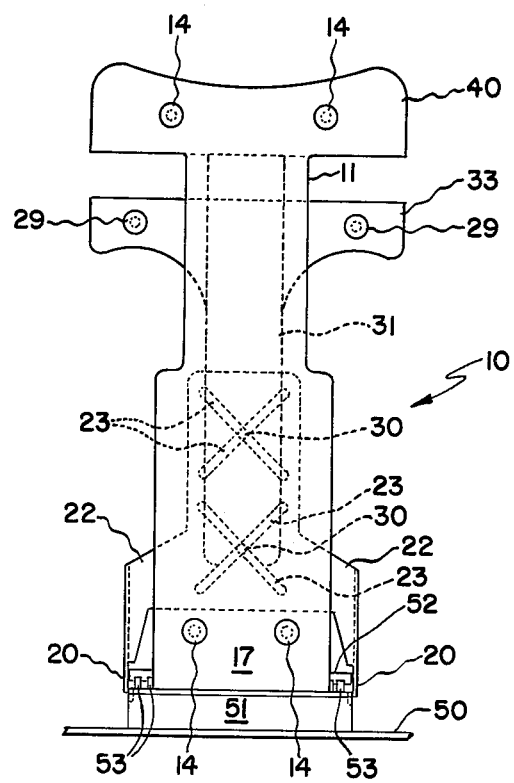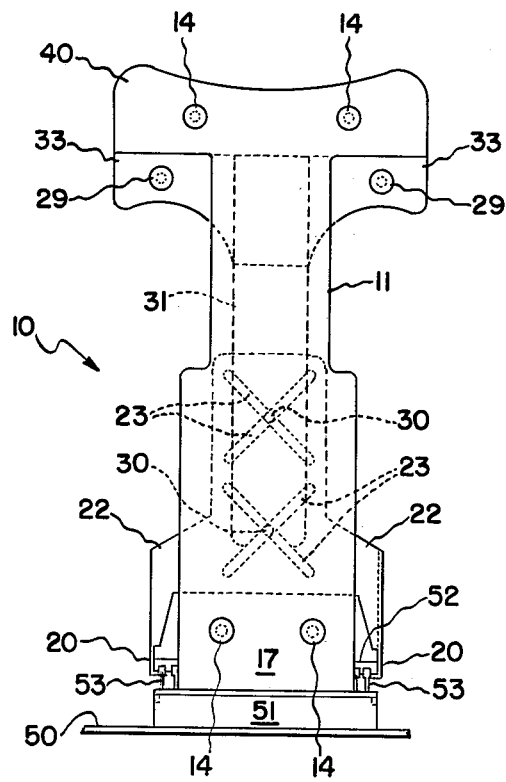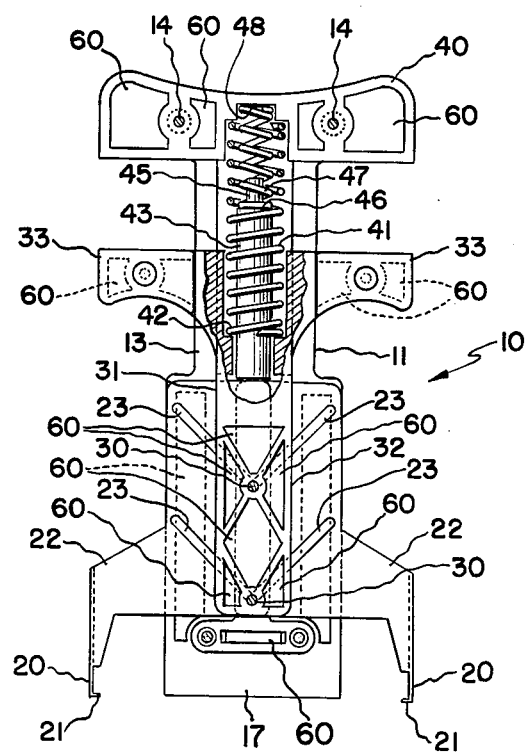

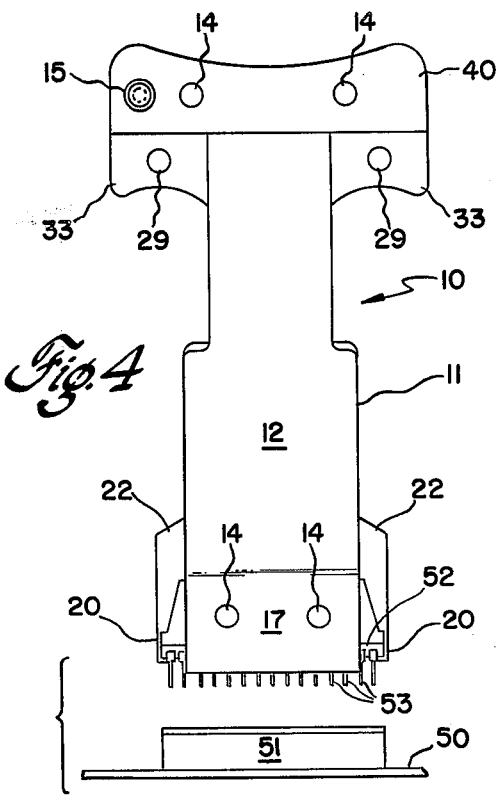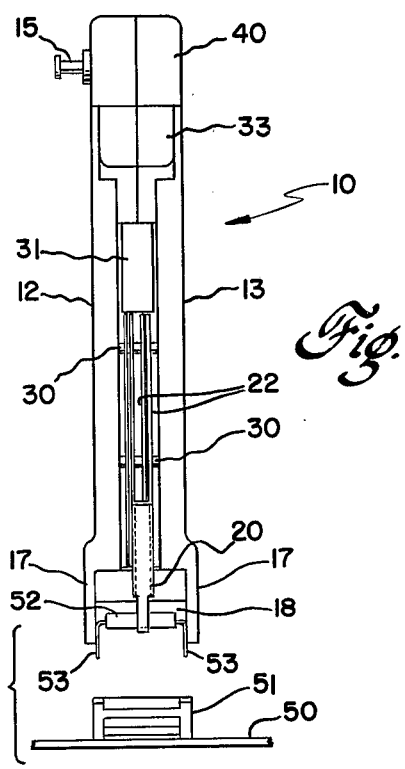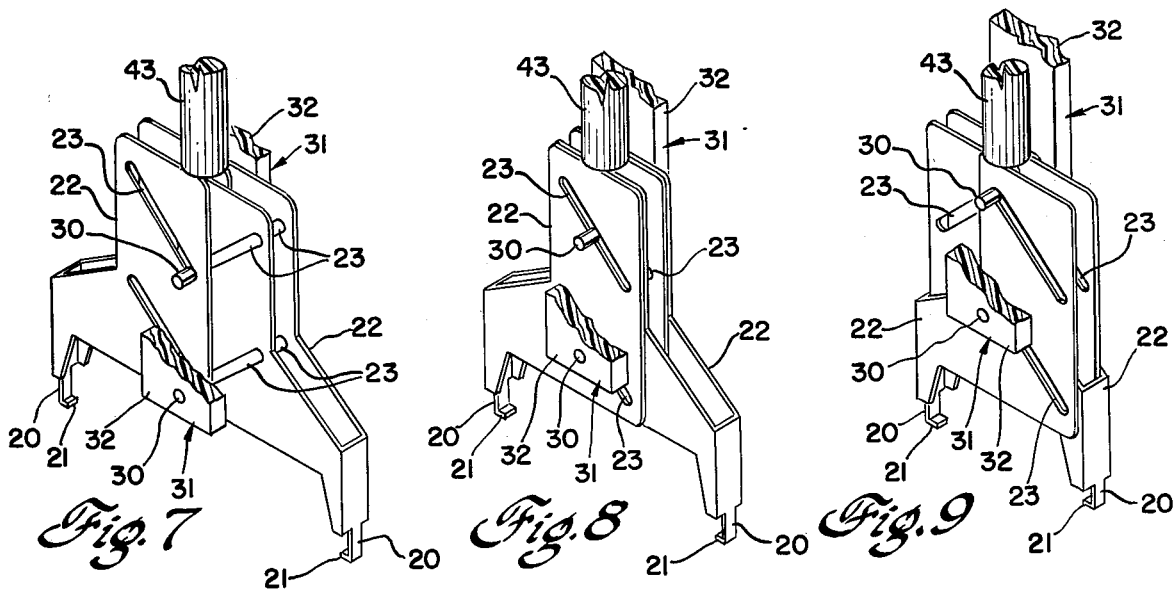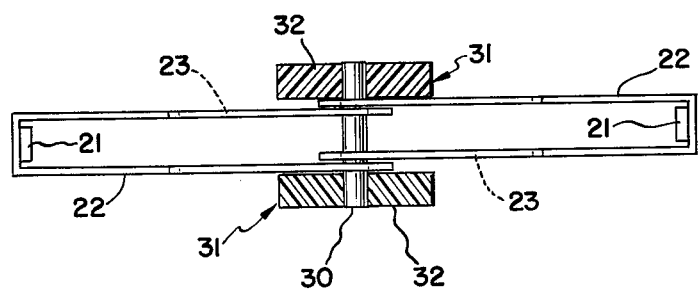

IC EXTRACTION TOOL

This invention relates to a tool for extracting or withdrawing integrated circuit (IC) electrical components from a socket or similar type of support.

ICs in use are typically plugged into sockets mounted on a printed circuit board (PCB). The typical dual inline IC package containing 24–40 pins has a width of approximately 15 mm and lengths varying from 36–50 mm. The pins are fragile and readily bent or deformed. To remove such components from a socket without deforming the pins, making their subsequent reinsertion cumbersome and time consuming, is a difficult task. IC extraction tools for ICs with 14 or less pins are known, and comprise a simple hairpin-shaped member provided at its ends with projecting fingers to grip the IC package for removal. However, such tools do not perform satisfactorily with the longer or larger ICs containing 24 or more pins.

The chief object of the invention is an IC extraction tool for withdrawing ICs from a socket without damaging or deforming the pins.

Briefly stated, the tool of the invention is characterized by an elongated handle provided at its bottom with package aligning means defining a recessed area for receiving the IC package and a pair of laterally movable fingers for gripping opposite ends of the IC package. Means are provided on the handle for actuation by the user to cause the gripping fingers to move toward one another from a normally open or rest position to a gripping position upon contacting the IC package. Additional means are provided in the handle in response to further actuation by the user and upon the gripping fingers reaching its gripping position to supply a pulling or withdrawing force on the IC, causing the IC to withdraw evenly and uniformly from its socket. Release of the actuation means then releases the IC from the tool.

The invention will be better understood from the detailed description that follows of one exemplary embodiment taken in conjunction with the accompanying drawings, wherein:

FIG. 1 illustrates the tool of the invention resting on a socket holding an IC prior to actuation of the tool;

FIG. 2 is a view similar to FIG. 1 after initial actuation of the tool showing grabbing of the IC but before lifting;

FIG. 3 is a view similar to FIG. 2 showing the IC being partly lifted from its socket;

FIG. 4 is a view similar to FIG. 1 showing the tool removing the IC from the socket;

FIG. 5 is a side view of the tool and socket in the position shown in FIG. 4;

FIG. 6 is a front view of the tool of FIG. 1 in rest position with the nearest half of the main body removed and portions of the front slider portion removed to show interior parts;

FIGS. 7–9 are perspective views of the telescoped finger bodies in, respectively, rest, partly telescoped, and fully telescoped positions;

FIG. 10 is a plan view from the top of the telescoped finger bodies in the rest position illustrated in FIG. 7;

Figure 11:
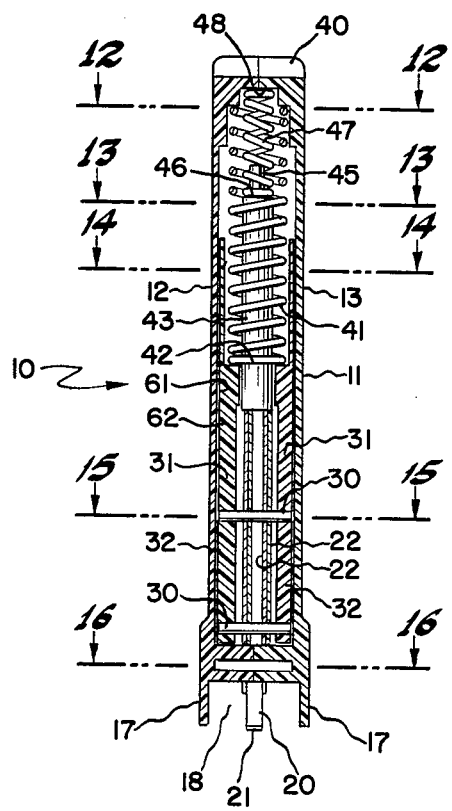
FIG. 11 is an axial cross-sectional view of the tool of FIG. 6, with the springs shown partly in full for clarity.

The figures illustrate one form of tool in accordance with the invention. The tool, indicated generally by 10, comprises an elongated handle having a main structural body portion 11, composed of two halves 12, 13 held together by suitable fasteners 14. While the main body portion may be of metal, it is preferably constituted of a suitable plastic, such as ABS (plating grade), which is chrome-plated (not shown) so as to have an electrically conductive surface. A conductive terminal, indicated at 15 (FIGS. 4 and 5), can be mounted on the body. Via the terminal 15, the tool can be electrically grounded by a wire to the PCB during removal of MOS ICs which are subject to static charge damage. The terminal 15 has only been shown in FIGS. 4 and 5 to avoid undue clutter of the drawing.

The body 11 has at its bottom a pair of depending opposed wall portions 17 which are spaced apart a distance slightly greater than the width of the IC, but slightly smaller than the width of the socket for the IC. Thus, when the tool 10 is placed over the socketed IC, the wall portions 17 will bracket the sides of the IC and rest on the edge of the socket. The wall portions 17 define a recess or cavity 18 (FIG. 5) within which the IC fits and is received during removal. Bounding the lateral sides of the recess are a pair of opposed fingers 20. The fingers 20 depend from the tool and are spaced apart in the rest position a lateral distance exceeding the length of the IC which the tool is designed to remove. For 24–40 pin ICs, the distance would be approximately $2\frac{1}{8}$ inches. The fingers 20 have at their bottom edge short inwardly-directed projections 21 which when moved laterally are adapted to fit under the IC package, in the small space between it and the socket, in order to grab it for removal.

The fingers 20 are each a part of a metallic body 22 illustrated in FIGS. 7–10. Each body 22 consists of folded spring metal, folded into a relatively flat position as shown, and has at its flat sides two obliquely-directed parallel slots 23 which serve to cam the fingers 20 upward upon actuation of the tool. The slots 23 in one finger body 22 are oppositely directed to those in the adjacent finger body. The bodies 22 interfit with one another such that their slots 23 overlap and telescope laterally along their flat sides. The finger bodies 22 are located within the main body halves 12, 13 and are maintained in operating position by a pair of dowel pins 30 which engage the aligned slots 23. The pins 30, in turn, are mounted on opposed slider members 31 which are adapted to move as a unit vertically within the main body portion 11 when actuated by the user. The slider members 31, which may also be of metal or plastic, constructed as the body 11 in two halves held together by fasteners 29 and the pins 30, each comprise a relatively flat piece having a central vertical portion 32 aligned with the tool's vertical axis and at the top a laterally projecting finger part 33 adapted to receive the user's fingers during operation. The main body 11 has a similarly configured laterally projecting portion 40, on which the terminal 15 is mounted, which is configured to receive at its top the thumb of the user.

The fingers 20 are biased into their down or rest position by a first compression spring 41 (FIG. 6), the top end of which bears against the main body portion 40, and the bottom end of which bears against a shoulder 42 built into and located between the slider halves 31. The first compression spring 41 is maintained in position by a counterbore in body 11 and by a centrally located pusher bar 43, whose bottom end rests on the tops of the telescoped finger bodies 22. The pusher bar 43, which extends within the spring 41, extends upward along the center of the tool, and is provided with a smaller diameter section 45 forming a shoulder 46. On the shoulder 46, surrounding the spring pusher bar 43, is a second, shorter and smaller diameter compression spring 47, whose upper end seats within a recess 48 in the handle portion 40. Both springs 41 and 47 are coaxial with each other and the pusher bar 43. The second compression spring 47 is wound tighter than the first compression spring 41 and thus exerts a greater compressive force on the pusher bar 43 than that exerted by the first compression spring 41. The intended result is that as the slider 31 is pulled up, only the first compression spring 41 which bears against the finger bodies 22 is compressed. When the fingers 20 grab the IC, preventing further lateral movement of the telescoped fingers bodies 22, then further upward motion of the slider 31 exerts an upward pulling force on the fingers 20, since they can no longer move laterally, carrying along with it the pusher bar 43, causing compression of the second compression spring 47.

The two pins 30 which are mounted on the slider halves 31 and engage the aligned obliquely-directed slots 23 in the fingers function to cam the fingers laterally toward one another in a telescoping action as illustrated in FIGS. 7 and 8. This lateral movement continues until the fingers 20 strike the IC edges, which prevents further lateral movement. Continued upward movement of the slider 31 now pulls the finger assembly 22 upward, withdrawing the IC from its socket, as shown in FIGS. 3 and 4. The pulling force is even and uniform and lifts the IC within the recess 18 bounded by the wall portions 17 and the depending finger portions 20, until the slider finger hold 33 strikes the bottom wall of the body lateral extension 40, as shown in FIGS. 3 and 4, or the IC hits the recess top wall. The total movement is about 9/16 inches, but is sufficient to release the IC pins from the socket holes and allow upward movement of the entire tool holding the IC. When the slider 31, 33 is released by the user, the springs 41, 47 force the slider 31, 33 down to its rest position illustrated in FIGS. 1 and 6, thus releasing the IC.

The above actions are illustrated in FIGS. 1-5, which also show a PCB 50 supporting an IC socket 51, and an IC 52 with pins 53. FIG. 8 shows the telescoped position of the fingers as they would appear if an IC were present and grabbed by the fingers. FIG. 9 shows the maximum telescoping position if an IC were not present.

Figure 12:
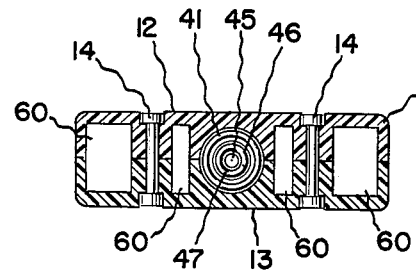
FIGS. 12–16 are cross-sectional views of the tool of FIG. 11 along, respectively, lines 12—12, 13—13, 14—14, 15—15, and 16—16.
Figure 13:
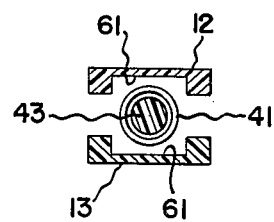
Figure 14:
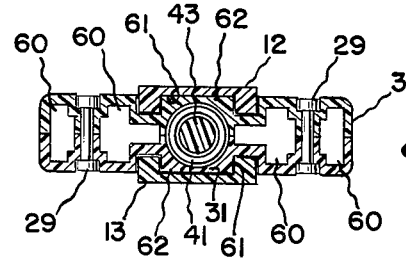
Figure 15:
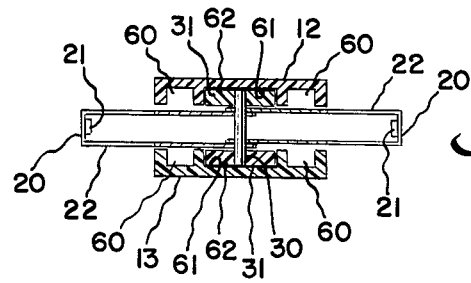
Figure 16:
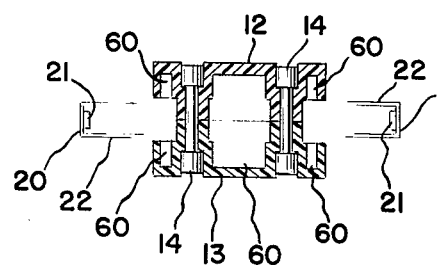

Details of the tool have been omitted from several of the drawing figures for the sake of clarity. For instance, non-functional cut-outs 60 have been provided in the main body and slider to reduce weight and material consumption. The manner in which the tool is assembled is shown more clearly in FIGS. 11-16. The main body halves 12 and 13 each has a grooved section 61 for receiving a correspondingly configured section 62 on the slider 31 holding the parts together and allowing the slider 31 to move vertically within the main body 11.

As will be clear from the foregoing description, the tool of the invention is characterized by simple and low-cost construction, yet will perform quite satisfactorily the delicate job of lifting an IC from its socket without deforming its pins by the application of an even or uniform lifting force. Proper positioning of the tool relative to the IC to assist in orthogonal withdrawal is readily afforded by the bottom side walls 17 which are spaced to rest on a standard socket. Moreover, lifting of the IC within these spaced sides 17 which assist in guiding the pins, as shown in FIG. 5, also helps in avoiding pin deformation. Still further, after extraction, the IC is held by the tool and can be placed out of harm's way until reuse. As a further advantage, the tool is self-adjusting to accommodate lengths of standard ICs having from 24-40 pins. Also, overpulling on the IC is avoided by the built in stop furnished by the handle 40 and slider 33 extensions limiting excessive motion. Finally, the tool can be constructed from low-cost plastic that can be metal plated, and thus the tool can be grounded when handling MOS ICs which are subject to static charge damage.

While my invention has been described in connection with specific embodiments thereof, those skilled in the art will recognize that various modifications are possible within the principles enunciated herein and thus the present invention is not to be limited to the specific embodiments disclosed.

I claim:

1. A packaged IC extraction tool comprising a handle portion having a bottom, means at the handle bottom forming a cavity for receiving the IC package, gripping means on the handle portion adjacent the cavity for gripping opposite sides of the IC package, said cavity being formed by opposed depending edges on the handle portion and by said gripping means, said gripping means comprising a pair of slideable telescoping members, means on the handle portion for actuating the gripping means from an open rest position allowing the package to enter the cavity to a gripping position where they contact the package, and means connected to the gripping means for developing a pulling force on the package capable of extracting the IC.

2. An extraction tool for a packaged IC having 24-40 pins, comprising a handle portion having a bottom, means at the handle bottom forming a cavity for receiving the IC package, laterally-movable gripping means on the handle portion adjacent the cavity for gripping opposite sides of the IC package, means on the handle portion for actuating the gripping means from an open rest position allowing the package to enter the cavity to a gripping position where they contact the package, means coupled to the gripping means and actuable upon the gripping means contacting the package for causing the gripping means to supply a pulling force on the package capable of extracting the IC, and means for releasing the IC from the tool, said gripping means comprising telescoping members, and the gripping means actuating means comprising means for camming the telescoping members into telescoping relation.

3. A packaged IC extraction tool as set forth in claim 2, wherein the gripping means comprise telescoping members, and the gripping means actuating means comprises means for camming the telescoping members into telescoping relation.

4. A packaged IC extraction tool as set forth in claim 3, wherein the camming means is configured to cause the telescoping means to move laterally between its rest and gripping positions and to move axially of the handle portion between its gripping and IC removal positions.

5. A packaged IC extraction tool as set forth in claim 4, wherein the actuating means comprises a pull-up slider on the handle portion and means for biasing the slider relative to the handle portion and the gripping means relative to the slider such that actuation of the slider causes the gripping means to move laterally and then upwardly upon reaching its gripping position.

6. A packaged IC extraction tool as set forth in claim 5, wherein the biasing means comprises a first compression spring biasing the gripping means with respect to the slider and to the handle portion, and a second compression spring biasing the gripping means with respect to the handle portion, said second spring applying a greater compressive force than said first spring.

7. A packaged IC extraction tool as set forth in claim 6, wherein a pusher bar is provided within the body and engaging the gripping means, the second spring exerting a force between the handle portion and the pusher bar.

8. A packaged IC extraction tool as set forth in claim 6, wherein the telescoping members comprise folded parts having aligned obliquely-directed slots, with the slots in one telescoping member being oppositely directed to that in the other telescoping member, and pin means mounted on the slider and engaging the slots in both telescoping members, said slots and pins comprising the camming means.

9. An extraction tool for packaged ICs having varying lengths, comprising an elongated handle portion having a longitudinal axis and a bottom, means at the handle bottom forming a cavity for receiving an IC package, gripping means on the handle portion adjacent the cavity and slideable laterally to the longitudinal axis to accommodate varying length packages for gripping opposite sides of an IC package located in the cavity, means on the handle portion upon being pulled axially for actuating the gripping means to slide laterally from an open rest position allowing an IC package to enter the cavity to a gripping position where they contact the package, means coupled to the gripping means and actuable upon the gripping means contacting the package during the continued axially pulling of the actuating means for causing the gripping means to supply a pulling force on the package capable of extracting the IC, and means for releasing the IC from the tool.

10. A packaged IC extraction tool as set forth in claim 9, wherein the IC has dual rows of spaced pins and the cavity is formed by fixed opposed depending walls on the handle portion and by the gripping means, said opposed depending walls being spaced by a distance matching the pin row spacing.

11. A packaged IC extraction tool as set forth in claim 10, wherein the gripping means comprise a pair of slideable telescoping members.

* * * * *